(12) United States Patent
Ueda et al.

(10) Patent No.: US 7,906,256 B2
(45) Date of Patent: *Mar. 15, 2011

(54) RECYCLING OF LARGE-SIZE PHOTOMASK SUBSTRATE

(75) Inventors: Shuhei Ueda, Joetsu (JP); Yukio Shibano, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 479 days.

This patent is subject to a terminal disclaimer.

(21) Appl. No.: 12/000,542

(22) Filed: Dec. 13, 2007

(65) Prior Publication Data

US 2008/0145770 A1   Jun. 19, 2008

(30) Foreign Application Priority Data

Dec. 15, 2006   (JP) .................................. 2006-338344

(51) Int. Cl.
  *G03F 1/00*   (2006.01)
  *G03F 1/14*   (2006.01)
  *B24B 1/00*   (2006.01)
  *B24C 1/04*   (2006.01)

(52) U.S. Cl. ............................................... 430/5; 451/38

(58) Field of Classification Search ........................ 430/5
See application file for complete search history.

(56) References Cited

U.S. PATENT DOCUMENTS

| 6,265,115 | B1 * | 7/2001 | Berkey et al. ..................... 430/5 |
| 7,608,542 | B2 * | 10/2009 | Ueda et al. ..................... 438/689 |
| 2002/0100164 | A1 * | 8/2002 | Tanaka et al. ................. 430/319 |
| 2003/0143403 | A1 * | 7/2003 | Shibano et al. ............... 428/410 |
| 2004/0035153 | A1 * | 2/2004 | Koike et al. ....................... 430/5 |
| 2005/0250426 | A1 * | 11/2005 | Ferme .............................. 451/63 |
| 2007/0132068 | A1 | 6/2007 | Shibano et al. |
| 2008/0125014 | A1 * | 5/2008 | Rosch et al. .................... 451/41 |

FOREIGN PATENT DOCUMENTS

| EP | 1 253 117 A1 | 10/2002 |
| EP | 1 333 313 A1 | 8/2003 |
| EP | 1 829 836 A1 | 9/2007 |
| JP | 2003-292346 A | 10/2003 |
| JP | 2004-359544 A | 12/2004 |
| WO | WO 01/50506 A1 | 7/2001 |

OTHER PUBLICATIONS

European Search Report issued on Sep. 13, 2010 in corresponding European Patent Application No. 07 25 4871.

* cited by examiner

*Primary Examiner* — Stephen Rosasco
*Assistant Examiner* — John Ruggles
(74) *Attorney, Agent, or Firm* — Birch, Stewart, Kolasch & Birch, LLP

(57) ABSTRACT

A used large-size photomask substrate having a patterned light-shielding film is recycled by (i) removing the light-shielding film from the used substrate to provide a photomask-forming glass substrate stock, (ii) resurfacing the glass substrate stock by sand blasting, (iii) repolishing the resurfaced glass substrate stock to yield a regenerated glass substrate stock, (iv) applying a light-shielding film onto the regenerated glass substrate stock to yield a regenerated photomask-forming blank, and (v) processing the light-shielding film of the blank into a pattern corresponding to a desired exposure of a mother glass, yielding a regenerated photomask substrate.

7 Claims, 2 Drawing Sheets

RECYCLING OF LARGE-SIZE PHOTOMASK SUBSTRATE

CROSS-REFERENCE TO RELATED APPLICATION

This non-provisional application claims priority under 35 U.S.C. §119(a) on Patent Application No. 2006-338344 filed in Japan on Dec. 15, 2006, the entire contents of which are hereby incorporated by reference.

TECHNICAL FIELD

This invention relates to a method of recycling large-size photomask substrates for use as photomask substrates on the array side or color filter side of TFT liquid crystal panels.

BACKGROUND ART

In general, TFT liquid crystal panels are constructed by filling liquid crystals between an array side substrate having TFT devices built therein and a color filter-bearing substrate. They are based on the active matrix addressing scheme where TFTs apply controlled voltages for controlled alignment of liquid crystals.

So far, liquid crystal panels have progressed to higher definitions from VGA to SVGA, XGA, SXGA, UXGA and QXGA. It is believed that degrees of definition ranging from 100 pixels per inch (ppi) class to 200 ppi class are necessary. This, combined with an expanding exposure range, imposes a strict exposure accuracy, especially overlay accuracy.

In the manufacture of the array side substrate, patterns are formed in plural layers on a mother glass such as non-alkaline glass by repeating light exposure through originals having circuit patterns drawn thereon, known as large-size photomasks. On the other hand, the color filter side substrate is manufactured by a lithographic process known as dye immersion process. In the manufacture of both array and color filter side structures, large-size photomask substrates are necessary. For a high accuracy of light exposure, such large-size photomask substrates are typically made of synthetic quartz glass characterized by a low coefficient of linear expansion.

Some panels are manufactured using the technology known as low-temperature polysilicon. In this case, it has been studied to bake a driver circuit or the like on a peripheral portion of glass, aside from the panel pixels, which requires light exposure of higher definition.

To accomplish a higher accuracy of light exposure, the flatness of substrates is important. There is a need for large-size photomask-forming substrates exhibiting a higher flatness in service, that is, when supported in an exposure apparatus.

On the other hand, large-size photomask substrates made of synthetic quartz are expensive. Once used as a photomask, the substrate becomes useless or wasteful. A substantial economical benefit would be obtainable if the used substrate were regenerated by baking another mask pattern.

However, in order to reuse large-size photomask substrates, they must be polished again to remove damages and stains which are inadvertently introduced during continuous exposure, transportation, film removal and other operations. Since the glass is thermally affected by image writing, it has thermal strains left within the bulk, which lead to local differences in the polishing rate. As a result, polishing may provide quartz glass with a stepped surface. It is thus important to select polishing conditions so as to eliminate such strains effectively while removing a minimal quantity of material.

The large-size photomask-forming substrate is processed for reuse in such a way that its thickness is reduced whenever it is repolished. As the large-size photomask-forming substrate becomes thinner, it undergoes a more deflection by its own weight at the horizontal attitude. Then substantial variations develop in the proximity gap between the photomask substrate and the motor glass serving as an array side or color filter side substrate in a TFT liquid crystal panel. This eventually reduces the exposure accuracy.

Addressing these problems, the inventors proposed in JP-A 2003-292346 and JP-A 2004-359544 a method for improving the flatness of a large-size glass substrate having a diagonal length of at least 500 mm, achieving a flatness/diagonal length of $4.8 \times 10^{-5}$ or less and a parallelism of 50 µm or less in the horizontal attitude.

However, no investigations have been made on the effective recycle of large-size photomask substrates wherein polishing conditions are selected so as to efficiently eliminate the above-mentioned strains and the like while removing a minimal quantity of material.

DISCLOSURE OF THE INVENTION

An object of the invention is to provide a recycle method of processing a used large-size photomask substrate into a regenerated large-size photomask substrate at a high efficiency while reducing a quantity of material removed.

The inventors have succeeded in processing a used large-size photomask substrate into a regenerated photomask substrate while avoiding the influence of configurational factors of the used large-size photomask substrate such as surface morphology and thickness variations and reducing a quantity of material removed, such that the regenerated photomask substrate exhibits a high flatness when installed in an exposure apparatus.

More particularly, when the regenerated photomask substrate is horizontally held in an exposure apparatus, substrate chucking means include the substrate upside support in which suction acts on the upper surface of the substrate along edges (four or two side support), and the substrate downside support in which the substrate rests on wedge supports in contact with the substrate lower surface along edges (usually two side support). Whether either means is utilized to hold the photomask substrate horizontally, the photomask substrate deflects and deforms by its own weight. This deformation becomes exaggerated as the photomask substrate becomes larger in size. Such deflection/deformation increases a variation of the proximity gap between the photomask substrate and a mother glass disposed beneath the photomask substrate for exposure, giving noticeable negative impact on the exposure accuracy.

In the prior art, approaches for reducing the proximity gap variation are taken. In the event where the substrate upside support by suction is utilized in supporting the photomask substrate in an exposure apparatus, a force is applied so as to displace the substrate upper surface edges upward and outward to reduce the deflection around the substrate center. In the event where the substrate downside support is utilized in supporting the photomask substrate in an exposure apparatus, a downward force is applied to the edges outside the substrate support position to similarly reduce the deflection around the substrate center. However, this method in which the means of supporting the substrate in the exposure apparatus is devised to make a correction on the exposure apparatus side for reducing the proximity gap variation has the drawback that it is difficult and cumbersome to control the force to be applied to the substrate. As the photomask substrate becomes larger in size, a larger force is necessary, rendering the control more difficult.

Another method of using a glass substrate (for forming a photomask substrate) which has been flattened in the vertical attitude does not perform well when the photomask substrate or glass substrate is increased in size to a diagonal length of at least 500 mm, specifically at least 800 mm, especially at least 1,800 mm.

For large-size glass substrates having a diagonal length of at least 500 mm, specifically at least 800 mm, especially at least 1,800 mm, from which array side or color filter side photomask substrates in TFT liquid crystal panels are formed, known methods for measuring the flatness and parallelism of front and back surfaces of such a substrate include an optical interference technique of counting the number of interference fringes and a laser scanning technique in which a laser displacement meter runs in proximity to the front and back surfaces of the substrate for scanning. The method of holding the substrate during the measurement is traditionally vertical holding whereas the substrate is most often held horizontally on actual use. The reason why the substrate is vertically held when the flatness and parallelism of front and back surfaces are measured is that it is difficult to measure an accuracy when the substrate deflects under its own weight in the horizontal attitude, many diverse ways are utilized for holding the substrate horizontally in the exposure apparatus, and it is difficult to measure flatness under the same conditions as in the actual use. Since the deflection of the substrate is in inverse proportion to the cube of the substrate thickness, the propensity of substrate size enlargement that thickness is also increased as size is increased suggests, from the aspect of deflection, a possibility that even when the flatness of a substrate as usually measured in the vertical attitude is less than several tens of microns, the substrate on actual exposure will deform several tens to hundreds of microns by its own weight. No such problems arise if the way of substrate holding in the measurement of an accuracy such as flatness and parallelism of front and back surfaces of a substrate is the same as the way of substrate holding during exposure, that is, the time when the substrate is on use. In the current situation, however, no method of accurately measuring the flatness and parallelism of front and back surfaces of a substrate using the same substrate holding way has been developed. Then, the measurement of the flatness and parallelism of front and back surfaces of a substrate has to resort to the measurement method on a substrate in the vertical attitude. However, the flatness obtained with this measurement method substantially differs from the flatness of such a large-size photomask substrate when held in an exposure apparatus.

Reference is made to the flatness of currently available glass substrates as large-size photomask substrates for TFT exposure, for example. When a substrate having a size of 450×550 mm and a thickness of 5 mm exhibits a flatness/diagonal length of up to $6 \times 10^{-6}$ (flatness ~4 μm) as measured in the vertical attitude, this substrate, provided it is held by horizontal four-side simple support, will undergo a deflection by its own weight which corresponds to a flatness/diagonal length of $4.7 \times 10^{-5}$ (flatness ~34 μm) as estimated by material strength calculation. Then during the actual use in the horizontal attitude, the flatness is around 34 μm. Also, when a substrate having a size of 1,220×1,400 mm and a thickness of 13 mm exhibits a flatness/diagonal length of up to $6 \times 10^{-6}$ (flatness ~11 μm) as measured in the vertical attitude, this substrate, provided it is held by horizontal four-side simple support, will undergo a deflection by its own weight which corresponds to a flatness/diagonal length of $1.3 \times 10^{-4}$ (flatness ~243 μm) as estimated by material strength calculation. Then during the actual use in the horizontal attitude, the flatness is around 243 μm. With respect to a correction of such deflections, countermeasure is taken mainly on the side of exposure apparatus in the prior art, but becomes difficult as a result of substrate size enlargement.

Addressing the recycling of large-size photomask substrates, the inventors have found that a photomask substrate can be regenerated from a used large-size photomask substrate by removing a light-shielding film from the used large-size photomask substrate to provide a glass substrate stock, resurfacing the glass substrate stock using a processing tool of sand blasting, repolishing it to yield a regenerated glass substrate stock, applying a light-shielding film thereto to yield a photomask-forming blank, and processing the blank according to a standard technique. It has also been found that the thus regenerated photomask substrate is advantageously used in a mother glass exposure process including attaching the regenerated photomask substrate having opposed sides to an exposure apparatus through support of opposed side edges, disposing adjacent to the regenerated photomask substrate a mother glass serving as an array side or color filter side substrate in a TFT liquid crystal panel, and irradiating light from the exposure apparatus to the mother glass through the regenerated photomask substrate.

Where the regenerated photomask substrate is used in the above-described application, the step of resurfacing a large-size photomask-forming glass substrate stock to be regenerated (obtained by removing a light-shielding film from a used large-size photomask substrate) by a processing tool of sand blasting should be performed as follows. When a finally necessary/sufficient processing quantity of material to be removed (for flattening and deformation-correction) and an area to be processed are determined by comprehensively taking into account quantities (1) to (5), specifically (1) a flattening quantity of material to be removed determined on the basis of height data of the flatness and parallelism of the front and back surfaces of the large-size glass substrate stock in the vertical attitude which are obtained by accurately measuring the flatness and parallelism of the front and back surfaces of the large-size glass substrate stock in the vertical attitude (i.e., in the state where a deflection by its own weight in the horizontal attitude does not occur), (2) a quantity of material to be removed given by previously taking into account a deflection of the substrate stock by its own weight, calculated from the thickness and size of the substrate stock and the support position when the photomask substrate (resulting from the substrate stock) is horizontally supported, (3) a quantity of material to be removed given by previously taking into account a deformation of the photomask substrate caused by the photomask substrate support when the photomask substrate is supported in the exposure apparatus, (4) a quantity of material to be removed as calculated from an accuracy distortion of a platen for supporting the mother glass, and (5) a quantity of material to be removed determined by previously taking into account changes of flatness during subsequent repolishing which may be either both-side or single-side polishing; and when a processing tool or the substrate stock is moved in the direction of the substrate stock surface to process the respective surfaces of the substrate stock; there is obtained a regenerated large-size glass substrate having a diagonal length of at least 500 mm, especially at least 1,000 mm, and a flatness/diagonal length of up to $4.8 \times 10^{-5}$ in the horizontal attitude. Then, when a photomask substrate formed from the regenerated large-size glass substrate is supported in an exposure apparatus, a variation of the proximity gap between the photomask substrate and a mother glass serving as an array side or color filter side substrate in a TFT liquid crystal panel is reduced, eliminating or mitigating a need for correction on the side of the exposure apparatus. As a result, the proximity gap variation is readily eliminated.

Accordingly, the present invention provides a method for recycling a large-size photomask substrate as defined below.

The invention provides a method of recycling a large-size photomask substrate, comprising the steps of:

(i) removing a patterned light-shielding film from a used large-size photomask substrate to provide a large-size photomask-forming glass substrate stock to be regenerated, (ii) resurfacing the glass substrate stock using a processing tool of sand blasting, (iii) repolishing the resurfaced glass substrate stock to yield a regenerated glass substrate stock, (iv) applying a light-shielding film onto the regenerated glass substrate stock to yield a regenerated large-size photomask-forming blank, and (v) processing the light-shielding film of the blank into a pattern corresponding to the desired exposure of a mother glass, yielding a regenerated photomask substrate.

Typically, the glass substrate stock resulting from step (i) has a diagonal length of at least 500 mm and a thickness of at least 3 mm.

In one preferred embodiment, the regenerated photomask substrate is to be used in a mother glass exposure process including attaching the regenerated photomask substrate having opposed sides to an exposure apparatus through support of opposed side edges, disposing adjacent to the regenerated photomask substrate a mother glass serving as an array side or color filter side substrate in a TFT liquid crystal panel, and irradiating light from the exposure apparatus to the mother glass through the regenerated photomask substrate. Step (ii) of resurfacing by sand blasting comprises the step of processing the large-size photomask-forming glass substrate stock having front and back surfaces and a diagonal length of at least 500 mm and a thickness of at least 3 mm, by removing therefrom (1) a flattening removal quantity of material based on height data of the flatness and parallelism of the front and back surfaces of the large-size glass substrate stock in the vertical attitude, plus a deformation-corrective removal quantity of material, through sand blasting. The deformation-corrective removal quantity is calculated from (2) a deflection of the glass substrate stock by its own weight in the horizontal attitude, calculated from the thickness and size of the glass substrate stock, and the support position when the regenerated photomask substrate is horizontally supported, (3) a deformation of the regenerated photomask substrate caused by the photomask substrate support when the regenerated photomask substrate is attached to the exposure apparatus, and (4) an accuracy distortion of a platen for supporting the mother glass to be exposed. The regenerated large-size glass substrate resulting from the glass substrate stock has such an arcuate shape in cross section that the surface to be opposed to the mother glass is concave when held vertically, and reduces the proximity gap variation between the mother glass and the regenerated photomask substrate which is held horizontally when the opposed side edges of the regenerated photomask substrate are supported in the exposure apparatus.

In a preferred embodiment, the quantity of material removed in steps (ii) and (iii) is at least 20 μm each from the front and back surfaces of the large-size photomask-forming glass substrate stock to be regenerated. Preferably the repolishing step (iii) includes primary polishing and secondary polishing. Often, the primary polishing step uses a polishing slurry containing cerium oxide, and the secondary polishing step uses a polishing slurry containing cerium oxide or a slurry containing colloidal silica.

In a preferred embodiment, the regenerated photomask substrate has a surface flatness corresponding to a surface flatness/diagonal length of up to $4.8 \times 10^{-5}$ in the horizontal attitude.

BENEFITS OF THE INVENTION

When a large-size photomask substrate regenerated from a used large-size glass substrate by the recycling method of the invention is used in the exposure process, the exposure accuracy, especially registration accuracy and resolution are improved. This not only enables exposure of a high definition large-size panel, but also reduces the burden of exposure correction and improves the production yield of panels. An exposure apparatus of the so-called proximity type (i.e., proximity aligner) which is used only on the color filter side in the prior art can be used on the TFT array side to which a projection exposure apparatus (i.e., projection aligner) is assigned in the prior art. Another potential advantage on the color filter side is that an exposure apparatus of the proximity type is adaptable to the black matrix and photo-spacer as well as RGB.

In the manufacture of a large-size photomask substrate according to the invention, there is obtained a large-size photomask substrate which has such an arcuate shape in cross section that the surface to be opposed to the mother glass is concave when held vertically. When only conventional repolishing is employed in recycling such a photomask substrate, the shape of a used large-size photomask substrate prior to recycling is left or at least the shape cannot be changed to any desired one. On use of sand blasting, a large-size photomask substrate of the desired shape complying with the required large-size photomask substrate can be efficiently produced at a reduced quantity of material removed, independent of the shape of a used large-size photomask substrate prior to recycling.

When exposure is carried out using a regenerated photomask substrate obtained by the recycling method of the invention, the proximity gap is made small and uniform (minimized variation) so that control of the proximity gap is facilitated. As a result, the number of products by exposure can be increased and the large-size glass substrate allows for efficient exposure. In addition, the number of substrate recycles can be increased and the cost of substrates is eventually reduced.

When projection exposure is carried out using a regenerated photomask substrate formed from the regenerated large-size glass substrate stock according to the invention, the burden of correction of a shifting of an optical axis by substrate deflection is reduced. A need for correction of the proximity gap on the exposure apparatus side is substantially eliminated.

DESCRIPTION OF THE PREFERRED EMBODIMENTS

The present invention may be understood more readily by reference to the following detailed description of preferred embodiments of the invention and the examples included therein. In the following specification and the claims which follow, reference will be made to a number of terms which shall be defined to have the following meanings.

A large-size substrate or substrate stock has a pair of opposite major surfaces (front and back surfaces); the lower surface that faces the mother glass during exposure is referred to as front surface and sometimes simply as substrate surface; the upper surface that is remote from the mother glass during exposure is referred to as back surface. As used herein, the term "surface flatness" is of the front surface. The shape of a large-size substrate or substrate stock may be square, rectangular, circular or the like. As used herein, the size of a substrate or substrate stock refers to a longitudinal length by a transverse length if it is rectangular or square, and to a diameter if it is circular. In the case of circular substrates, the diagonal length refers to the diameter.

As used herein, the term "horizontal attitude" refers to the state that a substrate is held horizontally so that its major surfaces extend in a horizontal direction, and the term "vertical attitude" refers to the state that a substrate is held vertically so that its major surfaces extend in a vertical direction.

Figure 1:
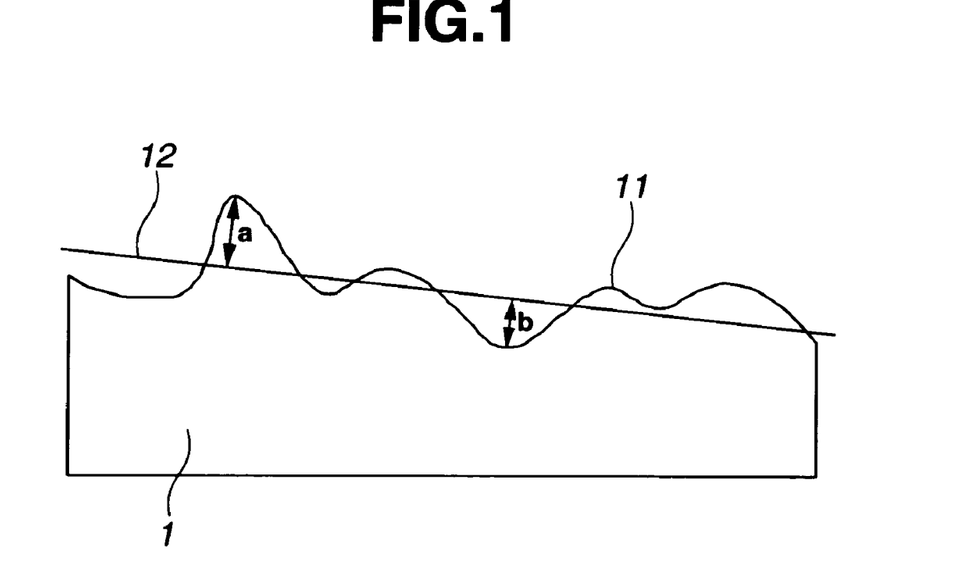
FIG. 1 is a schematic cross-sectional view of a substrate, illustrating a flatness.
Figure 2:
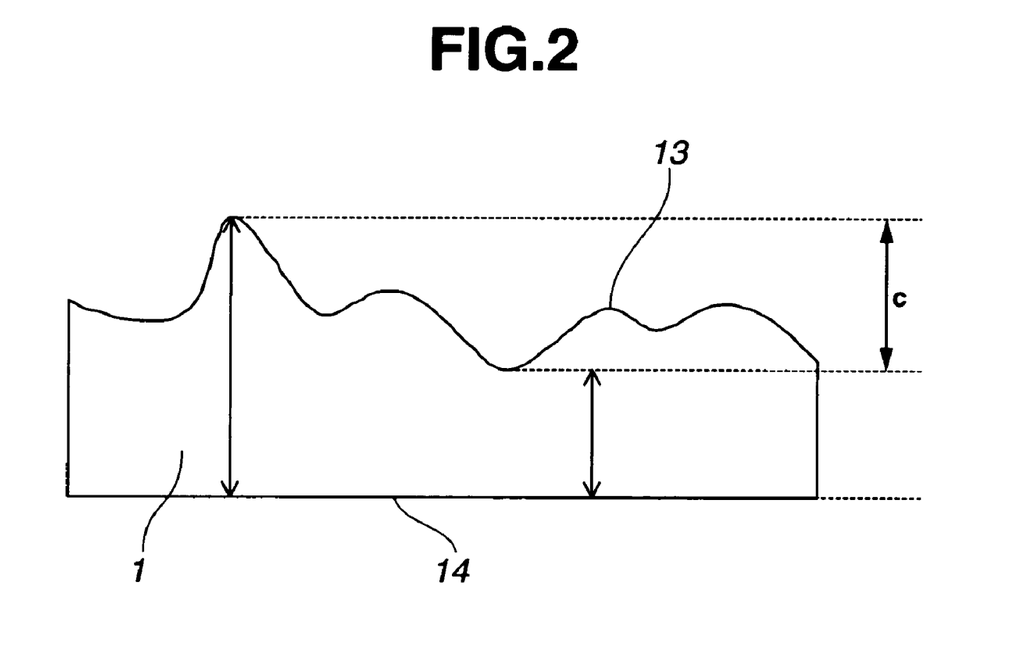
FIG. 2 is a schematic cross-sectional view of a substrate, illustrating a parallelism.

Referring to FIGS. 1 and 2, the flatness of a surface and the parallelism between opposite surfaces of a substrate under test are described. Provided that the least square plane 12 calculated from a surface 11 under test is used as a reference plane, the flatness is the sum of a maximum (absolute value) "a" and a minimum (absolute value) "b" of the distance between the surface 11 under test and the reference surface 12 as shown in FIG. 1. The flatness is generally known as SORI. The parallelism is the difference "c" between a maximum and a minimum of the distance between a front surface 13 and a back surface 14 as shown in FIG. 2. The parallelism is generally known as a total thickness variation (TTV).

One embodiment of the invention is a method for recycling a large-size photomask substrate, specifically for yielding a regenerated large-size photomask substrate having a diagonal length of at least 500 mm and a thickness of at least 3 mm and serving as an array side or color filter side substrate in a TFT liquid crystal panel. The method comprises the steps of:

(i) removing a patterned light-shielding film from a used large-size photomask substrate to give a large-size photomask-forming glass substrate stock to be regenerated, (ii) resurfacing the glass substrate stock using a processing tool of sand blasting, (iii) repolishing the resurfaced glass substrate stock to yield a regenerated glass substrate stock, (iv) applying a light-shielding film onto the regenerated glass substrate stock to yield a regenerated large-size photomask-forming blank, and (v) processing the light-shielding film of the blank into a pattern corresponding to the desired exposure of a mother glass, yielding a regenerated photomask substrate.

Removal of Light-shielding Film

The method for recycling a large-size photomask substrate according to the invention includes providing a used large-size photomask substrate having a patterned light-shielding film thereon, and removing the patterned light-shielding film from the used large-size photomask substrate to give a large-size photomask-forming glass substrate stock to be regenerated. The used large-size photomask substrate has a previously patterned light-shielding film, typically a chromium film formed thereon. For recycling, the light-shielding film must be removed.

A suitable means for removing the light-shielding film is selected in accordance with a particular material of which the light-shielding film is made as long as it can remove only the light-shielding film without attacking the underlying glass substrate stock.

Exemplary light-shielding films include those of Cr, Si, W, Al and the like. For example, the used large-size photomask substrate is preferably immersed in a remover solution of 13.7 wt % of ammonium cerium(IV) nitrate $(Ce(NO_3)_4 \cdot 2NH_4NO_3)$ and 3.3 wt % of perchloric acid in water when it has a Cr-based film, and in a remover solution of KOH when it has a Si-based film.

After removal of the light-shielding film, the large-size photomask-forming glass substrate stock to be recycled or regenerated is then resurfaced by a processing tool of sand blasting.

Material to be Removed

As substrates become larger in size, it becomes necessary to process or machine the large-size photomask-forming glass substrate stock for regeneration by previously taking into account not only (1) a flattening quantity of material to be removed from the glass substrate stock itself, but also (2) a deflection of the glass substrate stock by its own weight, calculated from the thickness and size of the glass substrate stock, and the support position when the regenerated photomask substrate (resulting from the glass substrate stock) is horizontally supported, (3) a deformation of the regenerated photomask substrate, caused by the photomask substrate support when the regenerated photomask substrate is attached to the exposure apparatus, (4) an accuracy distortion of a platen for supporting the mother glass subject to exposure, and (5) a change of flatness by subsequent repolishing. Although measurement of the substrate shape is ideally carried out in the zero gravity state, measurement in the vertical attitude is fully acceptable because the deflection of the substrate by its own weight in the vertical attitude is negligibly little for the accuracy of the substrate to be manufactured herein.

The quantities of material to be removed from a large-size photomask-forming glass substrate stock that should be considered in the method for preparing a regenerated large-size glass substrate according to the invention are: (1) a flattening quantity of material to be removed determined on the basis of height data of the flatness and parallelism of the front and back surfaces of the substrate stock in the vertical attitude which are obtained by accurately measuring the flatness and parallelism of the front and back surfaces of the substrate stock in the vertical attitude (i.e., in the state where a deflection by its own weight in the horizontal attitude does not occur), (2) a quantity of material to be removed given by previously taking into account a deflection of the glass substrate stock by its own weight, calculated from the thickness and size of the glass substrate stock and the support position when the photomask substrate (resulting from the substrate stock) is horizontally supported in the exposure apparatus, (3) a quantity of material to be removed given by previously taking into account a deformation of the regenerated photomask substrate caused by the photomask substrate support when the regenerated photomask substrate is supported in the exposure apparatus, (4) a quantity of material to be removed as calculated by taking into account an accuracy distortion of a platen for supporting the mother glass, and (5) a quantity of material to be removed determined by previously taking into account changes of flatness during subsequent repolishing which may be either both-side or single-side polishing. In the method for preparing a large-size glass substrate according to the invention, a finally necessary/sufficient processing quantity of material to be removed from front and back surfaces of a substrate stock and an area to be processed are determined by comprehensively taking into account the foregoing quantities (1) to (5). Processing operations by quantities (2), (3) and (4) are collectively referred to as deformation-corrective processing and the sum of quantities (2), (3) and (4) is referred to as a deformation-corrective removal quantity.

Flattening

First, a flattening quantity Q1 of material to be removed determined on the basis of height data of the flatness and parallelism of the front and back surfaces of a large-size glass substrate stock in the vertical attitude is described. A large-size glass substrate stock, typically plate stock, as the starting stock for regeneration is measured for flatness and parallelism. Measurement of flatness and parallelism may be carried out using a flatness meter, for example, FTT-1500 (Kuroda Precision Industries Ltd.) while holding the substrate stock in the vertical attitude in order to eliminate any deflection of the substrate stock by its own weight.

The method of the invention includes the step of measuring the flatness of opposite surfaces of a large-size glass substrate stock (or plate stock) to be flattened. When the parallelism of a large-size glass substrate stock should also be considered, the flatness and parallelism of opposite surfaces are measured. Specifically, height (in a direction perpendicular to substrate front and back surfaces) data indicative of the flatness and parallelism of front and back surfaces of a large-size glass substrate stock in the vertical attitude are obtained. Using as a reference plane the least square plane calculated from the surface to be flattened on the basis of the height data, a flattening removal quantity is calculated so that the height coincides with the lowest point within the surface to be flattened.

A program delivering to a computer a command for a processing tool to carry out flattening processing by removing a quantity of material calculated by the above step and simultaneously deformation-corrective processing (to be described later) may be stored in a computer-readable recording medium. Then simulation may be performed using the recording medium.

Deflection by Own Weight

A deflection of the regenerated large-size photomask substrate by its own weight is calculated on material strength basis from the thickness and size of the glass substrate stock and the support position of the regenerated photomask substrate (resulting from the substrate stock) when supported horizontally, using the surface calculated and presumed to result from the above flattening processing as a reference. The support position is the same as when the photomask substrate is supported in the exposure apparatus.

Substrate Deformation

The regenerated large-size photomask substrate is deformed when it is set in place in the exposure apparatus by chucking. The quantity of deformation varies with the area and shape of the chucked portions, the surface accuracy of chucking plates, and whether the chucking support is at two sides or four sides. Any of these factors can be simulated by the finite element method. In a preferred procedure, a dummy glass substrate stock is actually supported in place in the exposure apparatus, a quantity of deformation that the dummy glass substrate stock undergoes is measured, and then a quantity of material removal from a glass substrate stock to be processed is determined so as to comply with the measured quantity.

Accuracy Distortion of Platen

A variation of the distance between a mother glass serving as an array side or color filter side substrate in a TFT liquid crystal panel and the surface of the regenerated photomask substrate, known as proximity gap, can be affected by the flatness of a platen in the exposure apparatus (governed by the processing accuracy of the platen itself, the assembly accuracy of the platen, deformation by temperature during exposure and the like), that is, the accuracy distortion of the platen. This must be taken into account before the deformation-corrective removal quantity is determined. Likewise in a preferred procedure, a dummy glass substrate stock is actually supported in place in the exposure apparatus, a dummy mother glass is rested on a platen, a variation in the proximity gap therebetween is measured, and then a quantity of material removal from a glass substrate stock to be processed is determined so as to comply with the measured quantity.

Actually, a difference obtained by subtracting a processing quantity (obtained from flattening removal quantity and own weight deflection) from the proximity gap variation corresponds to a processing quantity based on substrate deformation and platen accuracy distortion.

It is noted that the proximity gap is measured from the lower side using a laser displacement meter.

Sand Blasting

When processing for flattening and deformation-corrective processing is carried out on the basis of the above-calculated quantities, processing with a controlled residence time is possible. Provided that the processing tool is a sand blasting tool, the feed rate of the sand blasting nozzle is slowed to extend the residence time where more substrate material should be removed based on the measured data, or inversely, the feed rate of the sand blasting nozzle is increased to shorten the residence time where less substrate material should be removed.

It is also possible to carry out processing by controlling the distance between the substrate stock and the sand blasting nozzle while setting the feed rate and pneumatic pressure of the nozzle fixed. This utilizes the processing characteristics that the processing speed is fast when the distance between the sand blasting nozzle and the substrate stock surface is short and is slow when the distance is long.

Instead, while the feed rate of the sand blasting nozzle is set constant, the processing is achievable through pressure control, such as by increasing the air blasting pressure of the sand blasting nozzle at the point for which a larger quantity of material removed is assigned and reducing the air blasting pressure at the point for which a smaller quantity of material removed is assigned.

Figure 3:
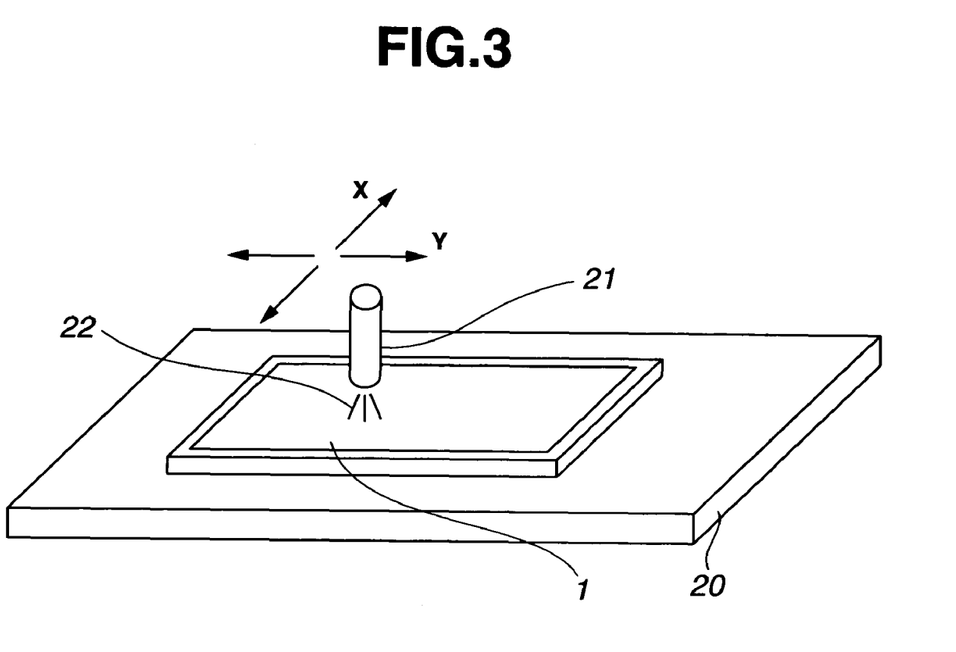
FIG. 3 is a perspective view of a processing apparatus.

In the event the processing tool is a sandblasting nozzle, processing is possible with the apparatus shown in FIG. 3. A sandblasting nozzle 21 for creating a blast 22 of abrasives is movable substantially parallel to a platform 20 and spaced from the surface of a substrate stock 1 on the platform 20 by a certain distance.

The processing tool is movable in X and Y directions while its movement is controlled by a computer. Equivalent processing is possible with an X-θ mechanism. Since the pneumatic pressure is related to the abrasives used and the tool-substrate distance, it is not determined unequivocally, but adjusted in terms of the removal rate and the depth of work damaged layer.

The abrasives used herein are not particularly limited although abrasives having a particle size of #600 to #3000 are preferred. Abrasives having a particle size of greater than #600 may induce more distortion by processing, and then a more amount of material must be removed in the post step to remove the work damaged layer, and more stock is necessary because the thickness must be increased. This may be uneconomical. If abrasives have a particle size of less than #3000, the removal rate may become slow, taking a longer time for sand blasting.

Fine particles used in the sand blasting are preferably cerium oxide, silicon oxide, aluminum oxide or silicon carbide.

Repolishing

The step of repolishing one or both surfaces of the glass substrate subsequent to the sand blasting step is carried out to improve surface roughness and eliminate microscopic defects, for example, so as to reach the finally desired surface quality. The quantity of material removed may be at least a quantity corresponding to the residual strain by sand blasting.

Finish polishing may be carried out on the front surface or the front and back surfaces in a conventional manner by means of a double- or single-side polishing machine using soft polishing cloth with abrasives such as cerium oxide.

In a preferred embodiment, the repolishing step includes primary polishing and secondary polishing because the quality of the finally finished surface is improved and the total polishing time is reduced. More preferably, the primary polishing step uses a polishing slurry containing cerium oxide, and the secondary polishing step uses a polishing slurry containing cerium oxide or a slurry containing colloidal silica. The particulate cerium oxide in the primary polishing slurry preferably has an average particle size of 0.7 to 1.5 μm as measured by the optical dispersion method. The particulate cerium oxide in the secondary polishing slurry preferably has an average particle size of 0.3 to 0.9 μm, which is smaller than that of the cerium oxide in the primary polishing slurry. The colloidal silica in the secondary polishing slurry preferably has an average particle size of up to 0.1 μm.

In the primary polishing, rigid pads comprising non-woven fabrics impregnated with urethane resins and pads of expanded rigid polyurethane having bubbles within the resin and at the surface are used. In the secondary polishing, pads of expanded flexible polyurethane having a flexible surface are used.

In the actual processing for removal, the feed rate (or residence time) of a processing tool or the substrate stock in a substrate surface direction is altered on the basis of the processing removal quantity (flattening and deformation-corrective processing quantities) determined by totaling quantities (1) to (5) calculated from the respective factors. Then a locally necessary and sufficient quantity is removed on the opposite surfaces of the substrate stock by the processing tool.

The total quantity of material removed during the resurfacing (by sand blasting) and subsequent repolishing steps may be determined as appropriate and not particularly limited although the preferred total quantity is at least 20 μm deep, specifically at least 30 μm deep, from each of the front and back surfaces of the large-size photomask glass substrate stock (to be regenerated). The upper limit is generally up to 1,000 μm, though it depends on the substrate thickness or the like.

Substrate

The large-size photomask-forming glass substrate stock (to be regenerated) obtained by removing the light-shielding film from the used photomask substrate according to the inventive method has a diagonal length of at least 500 mm, preferably at least 800 mm, more preferably at least 1,800 mm, and a thickness of at least 3 mm. The diagonal length is usually up to 2,500 mm although the upper limit need not be specified. For a diagonal length of up to 825 mm (500 to 825 mm), the thickness is in a range of 3 mm to less than 6 mm; for a diagonal length of 800 to 1,650 mm, the thickness is in a range of 6 to 11 mm; for a diagonal length of 1,800 to 2,150 mm, the thickness is in a range of 9 to 16 mm; for a diagonal length of 2,151 to 3,000 mm, the thickness is in a range of 9 to 20 mm. The shape of the large-size photomask-forming glass substrate may be square, rectangle, circle, etc. When the substrate has a circular shape, the diagonal length means a diameter.

The large-size photomask-forming glass substrate stock resulting from sand blasting and repolishing steps has such an arcuate shape in cross section that the surface to be opposed to the mother glass is concave in the vertical attitude. The large-size photomask-forming glass substrate stock exhibits a surface flatness/diagonal length of up to $4.8 \times 10^{-5}$, preferably up to $2.4 \times 10^{-5}$, more preferably up to $1.2 \times 10^{-5}$, at the horizontal attitude, that is, when it is held horizontally during exposure. The surface flatness/diagonal length is usually at least $2 \times 10^{-6}$ although the lower limit need not be specified. The back surface does not require a flatness as does the front surface. Though not critical for this reason, the back surface flatness/diagonal length is preferably up to $4.8 \times 10^{-5}$, more preferably up to $2.4 \times 10^{-5}$. The back surface flatness/diagonal length is usually at least $2 \times 10^{-6}$ although the lower limit need not be specified.

The large-size photomask-forming glass substrate stock preferably has a parallelism of up to 50 μm, more preferably up to 10 μm. With a parallelism of more than 50 μm, an extra burden may be imposed on such an operation as a correction to reduce the exposure gap when the substrate is installed in the exposure apparatus.

Exposure

A mother glass exposure process using the regenerated large-size photomask-forming glass substrate stock is described. By substantially the same technique as the lithographic technique of processing photomasks, a light-shielding film such as a chromium thin-film is formed on the surface of the large-size glass substrate stock using a sputtering system, thereby yielding a photomask blank. A photosensitive material, typically resist material is coated thereon, exposed imagewise using an electron beam apparatus, and developed to form a resist pattern. The light-shielding film such as chromium thin-film is then etched while using the resist pattern as a mask, forming a patterned light-shielding film such as chromium film.

As used herein, the term "light-shielding film" refers to any film that can inhibit complete transmission of light when the mother glass is exposed to light via the photomask substrate and includes not only opaque films, but also translucent and half-tone films. The light-shielding film is generally formed of Cr, Si, W, Al and the like and include an antireflective coating of such metal oxide. It may have a single layer or multilayer structure.

The regenerated photomask substrate thus obtained is rested horizontally on a substrate stage. The photomask substrate is generally supported on the upper or lower surface and at positions spaced several millimeters or several centimeters inside from the side edge. Specifically, the photomask substrate is held horizontally and secured at peripheral two or four sides on the upper surface by suction or vacuum chucking via alumina ceramic plates having a band width of 4 cm. In the case of fixed securing via ceramic plates, the ceramic plates are preferably rigid and constructed for tilting motion in a horizontal direction. Preferably the suction plates have a flatness of up to 5 μm. By virtue of the invention, a quantity of deformation of the substrate by clamping can be simulated using a computer-readable recording medium having the program previously recorded therein. The mechanism of tilting the suction plates is not always necessary. The influence of the accuracy of suction plates and a quantity of deformation by a stress caused by clamping of the substrate can also be simulated using the computer-readable recording medium having the program previously recorded therein. The influence of tilting angle can also be simulated.

The mother glass disposed beneath the photomask substrate and subject to exposure may be a glass plate having a thickness of 0.5 to 1.2 mm with a thickness error within 100 μm. The stage used for chucking the mother glass should preferably be finished to a flatness within 20 μm, more preferably within 5 μm.

Thereafter, the proximity gap between the photomask substrate and the mother glass is measured over substantially the entire region by a laser displacement meter. The proximity gap thus measured has an average value of 50 to 100 μm and a gap error of 0 to 50 μm, preferably 0 to 10 μm, over the entire region excluding the peripheral regions extending 4 cm from the long sides.

The exposure method of the invention is applicable to other exposure systems including mirror projection and lens projection systems as long as exposure is made through the photomask substrate and the mother glass which are not kept in contact. Although the proximity gap is not involved, these systems normally carry out correction of a deflection of the photomask substrate by its own weight on the exposure apparatus side. Then, using the photomask substrate formed from the glass substrate according to the invention, the burden of correction on the exposure apparatus side is reduced or eliminated.

As discussed above, the present invention overcomes the outstanding problems of the prior art by calculating a deflection of every glass substrate by its own weight relative to its thickness, and processing the glass substrate stock to a shape that is inversely pre-deformed by that deflection. The thickness of glass substrate can be made thinner than in the prior art. For example, a glass substrate having a size of 830 by 960 mm and a thickness of 10 mm experiences a deflection by its own weight which is calculated in terms of material strength to be 89 μm under the four-side simple support condition. Similarly, a glass substrate having a size of 830 by 960 mm and a thickness of 8 mm experiences a deflection of 139 μm, and a glass substrate having a size of 830 by 960 mm and a thickness of 6 mm experiences a deflection of 247 μm. Once a glass substrate is processed to create a surface thereof on service (i.e., the lower surface during exposure) which is concave by the quantity of deflection in the vertical attitude, the glass substrate becomes fully flat in the horizontal attitude. This suggests that a large-size photomask substrate can be repeatedly regenerated even from a thin substrate by calculating a deflection amount of a regenerated substrate on every cycle and processing the substrate stock to a shape which is inversely deflected by that deflection amount, and then the regenerated large-size photomask substrate virtually exhibits a high flatness when installed in the exposure apparatus.

Since the large-size photomask-forming glass substrate stock is resurfaced and repolished, the regenerated substrate has a thickness which is smaller than before regeneration. In proportion to that thickness reduction, the substrate is prone to flex when mounted on an exposure apparatus, suggesting that it is difficult to produce a large-size photomask substrate having a high flatness. The recycling method of the invention ensures, theoretically, that the substrate can be regenerated repeatedly until the thickness of a substrate above which a deflection by its own weight can be taken into account is reached. This increases the number of substrate regeneration cycles and eventually leads to a reduction of substrate cost.

When the mother glass is exposed through a photomask substrate formed from the regenerated large-size glass substrate stock of the invention, the proximity gap is made smaller and uniform so that control of the proximity gap is facilitated. As a result, the number of products by exposure can be increased and the mother glass efficiently exposed. When projection exposure is carried out using a regenerated photomask substrate formed from the regenerated large-size glass substrate stock of the invention, the correction of a shifting of an optical axis by substrate deflection can be easily controlled.

EXAMPLE

Examples of the invention are given below by way of illustration and not by way of limitation. In Examples, flatness refers to front surface flatness unless otherwise stated. The flatness and parallelism of a substrate stock or substrate were measured using a flatness tester FTT-1500 by Kuroda Precision Industries Ltd. while holding the substrate stock or substrate vertically.

Example 1

A used large-size photomask substrate with a chromium light-shielding film had a size of 330 mm×450 mm (diagonal length approx. 558 mm) and a thickness of 5.0 mm. It was immersed in a remover solution of 13.7 wt % of ammonium cerium(IV) nitrate ($Ce(NO_3)_4 \cdot 2NH_4NO_3$) and 3.3 wt % of perchloric acid in water. The chromium light-shielding film was thus removed, yielding a glass substrate stock.

The substrate stock was measured for accuracy in the vertical attitude, finding a front surface flatness of 8 μm (surface flatness/diagonal length=$1.43 \times 10^{-5}$), a back surface flatness of 8 μm, and a parallelism of 8 μm. It was of a shape having a raised center portion relative to the least square plane.

Then, a deflection of the substrate stock by its own weight when held horizontally was calculated using material strength and the support position of a substrate when held horizontally. A substrate deformation and platen accuracy distortion were previously inspected from a quantity of deformation of a dummy glass substrate stock which was actually supported in place in the exposure apparatus and a variation of the proximity gap between this dummy glass substrate stock and a dummy mother glass resting on a platen, respectively. A quantity of material removal from a glass substrate stock to be processed was determined by taking into account the above-obtained deflection, deformation and distortion values. Consequently, a necessary sufficient removal quantity at each portion was determined by taking into account the above values, so that the front surface might be concave by 11 μm in the vertical attitude and the back surface is convex by 11 μm at the same time, and further taking into account irregularities on the front and back surfaces and thickness variations as measured in the vertical attitude and changes of flatness and parallelism when both the surfaces would be later polished away by about 50 μm in total by the subsequent repolishing step. Removal operation was performed by means of a processing tool as shown below while controlling the feed rate of the tool in accordance with the removal quantity.

Specifically, the substrate stock was mounted on a platform 20 of the apparatus shown in FIG. 3. The apparatus included a processing tool having a pneumatic mechanism. The processing tool having a sandblasting nozzle 21 was movable in X and Y directions and substantially parallel to the platform 20. The tool was capable of blasting abrasive grits 22 (FO#800 by Fujimi Abrasive Co., Ltd.) under a pneumatic pressure of 0.1 MPa. The sandblasting nozzle had a rectangular ejection hole of 1 mm by 40 mm and was spaced from the surface of the substrate stock 1 by a distance of 40 mm.

Figure 4:
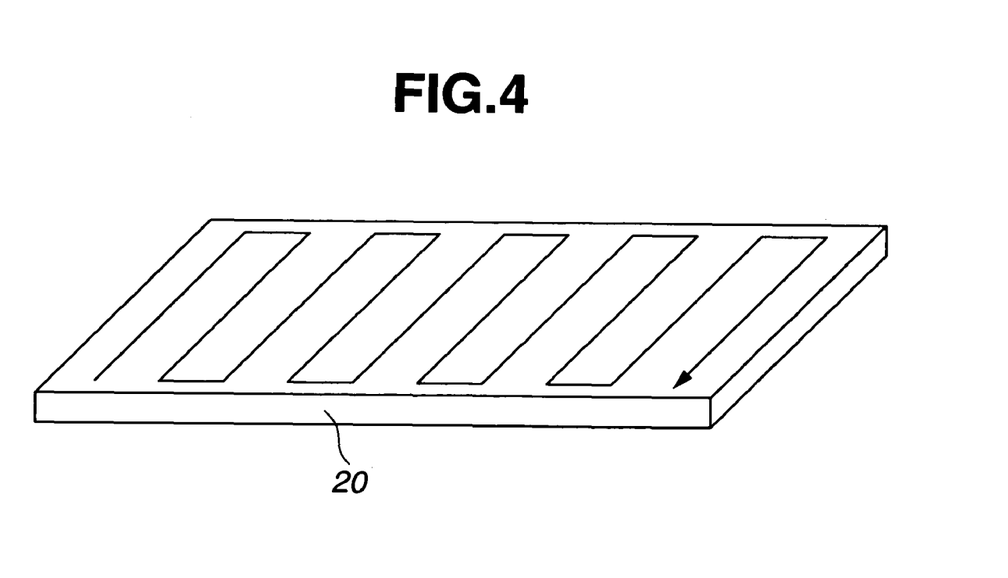
FIG. 4 is a perspective view showing the travel mode of a processing tool.

The processing technique involved moving the sandblasting nozzle continuously parallel to X axis, then moving a distance or pitch of 20 mm in Y axis direction, and so on as shown in FIG. 4. From the previously measured values, the processing rate under these conditions was computed to be 300 μm/min.

The feed rate of the sand-blasting nozzle was controlled in accordance with the necessary sufficient quantity to be removed which was determined by comprehensively taking into account (1) a flattening quantity of material to be removed determined on the basis of height data of the flatness of the front and back surfaces and the parallelism therebetween of the large-size glass substrate stock in the vertical attitude which are obtained by accurately measuring the flatness of the front and back surfaces of the large-size glass substrate stock in the vertical attitude (i.e., in the state where a deflection by its own weight in the horizontal attitude does not occur), (2) a quantity of material to be removed given by previously taking into account a deflection of the substrate stock by its own weight, calculated from the thickness and size of the substrate stock and the support position when the regenerated photomask substrate (resulting from the substrate stock) is horizontally supported, (3) a quantity of material to be removed given by previously taking into account a deformation of the regenerated photomask substrate caused by the photomask substrate support when the regenerated photomask substrate is supported in the exposure apparatus, (4) a quantity of material to be removed given by previously taking into account an accuracy distortion of a platen for supporting the mother glass, and (5) a quantity of material to be removed determined by previously taking into account changes of flatness during subsequent both-side or single-side polishing. The feed rate of the processing tool was 50 mm/sec at the portion of the substrate shape to which a smallest quantity of material removed was assigned on calculation. The above operation was performed on both the surfaces.

Subsequent to the sand blasting, the substrate stock was repolished by a double-side polishing tool. Specifically, the repolishing included primary and secondary polishing steps. The primary polishing step used a pad of expanded rigid polyurethane as the polishing cloth and cerium oxide as the abrasive and assumed a material removal quantity (or depth) of 15 μm. The secondary polishing step used a pad of expanded flexible polyurethane as the polishing cloth and colloidal silica as the abrasive and assumed a material removal quantity (or depth) of 5 μm. By the repolishing step, the substrate stock were polished away by 20 μm on each of the front and back surfaces and by 40 μm in total on both the surfaces. Thereafter, the surface flatness was measured to find that the surface had a flatness of 13 μm (flatness/diagonal length=$2.3\times10^{-5}$) and was of inverted dome shape. The parallelism was 2 μm. When a regenerated photomask substrate is horizontally held in an exposure apparatus by engagement for free motion at four sides, this corresponds to a flatness of 2 μm on calculation (flatness/diagonal length=$3.6\times10^{-6}$). This means that a substrate having a flatness of 2 μm (flatness/diagonal length =$3.6\times10^{-6}$) in the horizontal attitude is obtained.

Next, the regenerated large-size photomask-forming glass substrate stock was provided with a chromium thin-film pattern by a process similar to a conventional lithographic photomask substrate manufacturing process. Specifically, a chromium thin-film was formed on the surface of the glass substrate using a sputtering system. A photosensitive composition, typically resist was coated thereon, exposed imagewise by means of an electron beam apparatus, and developed to form a pattern. Thereafter, the chromium thin-film was etched using the resist pattern as a mask, forming a patterned chromium film.

The photomask substrate was horizontally rested on a substrate stage. While the substrate was held horizontally, the substrate was secured at two peripheral sides on the upper surface by suction using porous ceramic plates having a band width of 4 cm. The ceramic plates were rigid and configured for free tilting in a horizontal direction. These suction plates had a flatness of 1 μm.

On the other hand, a stage for chucking a mother glass to be disposed beneath the photomask substrate for exposure was finished to a flatness of 5 μm or less. A glass plate having a size of 300×400 mm and a thickness of 0.7 mm with a thickness error within 2 μm was rested on the stage.

The proximity gap between the regenerated photomask substrate and the mother glass was measured over substantially the entire region using a laser displacement meter. The measurements of proximity gap included a maximum value of 53 μm and a minimum value of 47 μm, over the entire region excluding the peripheral regions extending 4 cm from the sides, with a gap error of 6 μm.

Example 2

The procedure of Example 1 was repeated except that the used large-size photomask substrate had a size of 520 mm ×800 mm (diagonal length approx. 954 mm) and a thickness of 10.0 mm.

The proximity gap was measured over substantially the entire region using a laser displacement meter. The measurements of proximity gap included a maximum value of 58 μm and a minimum value of 47 μm, over the entire region excluding the peripheral regions extending 4 cm from the sides, with a gap error of 11 μm.

Example 3

The procedure of Example 1 was repeated except that the used large-size photomask substrate had a size of 850 mm×1,200 mm (diagonal length approx. 1,471 mm) and a thickness of 10.0 mm.

The proximity gap was measured over substantially the entire region using a laser displacement meter. The measurements of proximity gap included a maximum value of 59 μm and a minimum value of 47 μm, over the entire region excluding the peripheral regions extending 4 cm from the sides, with a gap error of 12 μm.

Example 4

The procedure of Example 1 was repeated except that the used large-size photomask substrate had a size of 1,220 mm×1,400 mm (diagonal length approx. 1,857 mm) and a thickness of 13.0 mm.

The proximity gap was measured over substantially the entire region using a laser displacement meter. The measurements of proximity gap included a maximum value of 61 μm and a minimum value of 46 μm, over the entire region excluding the peripheral regions extending 4 cm from the sides, with a gap error of 15 μm.

Example 5

The procedure of Example 1 was repeated except that the used large-size photomask substrate had a size of 1,220 mm×1,400 mm (diagonal length approx. 1,857 mm) and a thickness of 8.0 mm.

The proximity gap was measured over substantially the entire region using a laser displacement meter. The measurements of proximity gap included a maximum value of 61 μm and a minimum value of 46 μm, over the entire region excluding the peripheral regions extending 4 cm from the sides, with a gap error of 15 μm.

Comparative Example 1

The used large-size photomask substrate had a size of 850 mm×1,200 mm (diagonal length approx. 1,471 mm) and a thickness of 10.0 mm. The substrate was polished by 20 μm on each of the front and back surfaces, i.e., 40 μm in total, by a double-side polishing tool as in Example 1, without previously taking into account the deflection by its own weight. The surface flatness was then measured to find that the surface had a flatness of 4 μm (flatness/diagonal length =2.7×10$^{-6}$). The parallelism was 2 μm. Local steps were observed on the thus regenerated large-size photomask substrate.

When the deflection of the substrate by its own weight obtained by computation was added to the measured value, the resultant flatness was about 193 μm (flatness/diagonal length =1.3×10$^{-4}$), indicating a convex shape.

Next, as in Example 1, the glass substrate was processed into a photomask substrate, which was disposed in place in an exposure apparatus. The proximity gap was measured over substantially the entire region using a laser displacement meter. The measurements of proximity gap included a maximum value of 320 μm and a minimum-value of 120 μm, over the entire region excluding the peripheral regions extending 4 cm from the sides, with a gap error of 200 μm.

It is noted that the proximity gap measured above had not been corrected on the exposure apparatus side.

Comparative Example 2

The procedure of Comparative Example 1 was repeated except that the used large-size photomask substrate had a size of 1,220 mm×1,400 mm (diagonal length approx. 1,857 mm) and a thickness of 8.0 mm.

Thereafter, as in Comparative Example 1, the substrate was polished on both the surfaces by a total removal quantity of 50 μm by a double-side polishing tool, whereupon the surface flatness was measured to find that the surface had a flatness of 4 μm (flatness/diagonal length=2.2×10$^{-6}$). The parallelism was 2 μm.

Next, as in Comparative Example 1, the glass substrate was processed into a photomask substrate, which was disposed in place in an exposure apparatus. The proximity gap was measured over substantially the entire region using a laser displacement meter. The measurements of proximity gap included a maximum value of 180 μm and a minimum value of 120 μm, over the entire region excluding the peripheral regions extending 4 cm from the sides, with a gap error of 60 μm.

It is noted that the proximity gap measured above had been corrected on the exposure apparatus side.

For Examples and Comparative Examples, the measured results of flatness and parallelism before and after processing are summarized in Table 1.

TABLE 1

| | | Substrate size (mm) thickness (mm) | Before regenerating process Flatness, front/back (μm) | Parallelism (μm) | After regenerating process Surface flatness (μm) | Parallelism (μm) | Horizontal attitude (calculated) Surface flatness (μm) Flatness/diagonal length | Parallelism (μm) | Proximity gap Maximum (μm) | Minimum (μm) | Error (μm) |
|---|---|---|---|---|---|---|---|---|---|---|---|
| Example | 1 | 330 × 450 × 5.0 | 8/8 | 8 | 13 | 2 | 2<br>3.6 × 10$^{-6}$ | 2 | 53 | 47 | 6 |
| | 2 | 520 × 800 × 10.0 | 26/30 | 10 | 23 | 3 | 2<br>2.1 × 10$^{-6}$ | 3 | 58 | 47 | 11 |
| | 3 | 850 × 1,200 × 10.0 | 15/20 | 15 | 136 | 3 | 2<br>1.4 × 10$^{-6}$ | 3 | 59 | 47 | 12 |
| | 4 | 1,220 × 1,400 × 13.0 | 15/20 | 16 | 243 | 3 | 2<br>1.1 × 10$^{-6}$ | 36 | 61 | 46 | 15 |
| | 5 | 1,220 × 1,400 × 8.0 | 15/20 | 16 | 560 | 3 | 2<br>1.1 × 10$^{-6}$ | 3 | 61 | 46 | 15 |
| Comparative Example | 1 | 850 × 1,200 × 10.0 | 29/29 | 18 | 18 | 2 | 193<br>1.3 × 10$^{-4}$ | 2 | 320 | 120 | 200 |
| | 2 | 1,220 × 1,400 × 8.0 | 26/28 | 24 | 4 | 2 | 550<br>2.9 × 10$^{-4}$ | 2 | 180 | 120 | 60 |

Japanese Patent Application No. 2006-338344 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of recycling a large-sized photomask substrate, comprising the steps of:
   (i) removing a patterned light-shielding film from a used large-sized photomask substrate to provide a large-sized photomask-forming glass substrate stock to be regenerated having a diagonal length of at least 500 mm and a thickness of at least 3 mm;

(ii) resurfacing the glass substrate stock using a processing tool of sand blasting;
(iii) repolishing the resurfaced glass substrate stock to yield a regenerated glass substrate stock;
(iv) applying a light-shielding film onto the regenerated glass substrate stock to yield a regenerated large-sized photomask-forming blank; and
(v) processing the light-shielding film of the blank into a pattern corresponding to a desired exposure of a mother glass, yielding a regenerated photomask substrate, wherein the regenerated photomask substrate is suitable for use in a mother glass exposure process including attaching the regenerated photomask substrate having opposed sides to an exposure apparatus through support of opposed side edges, disposing, adjacent to the regenerated photomask substrate, a mother glass serving as an array side or color filter side substrate in a TFT liquid crystal panel, and irradiating light from the exposure apparatus to the mother glass through the regenerated photomask substrate, and said step (ii) of resurfacing by sand blasting comprises the step of processing the large-sized photomask-forming glass substrate stock having front and back surfaces with the diagonal length of at least 500 mm and the thickness of at least 3 mm, by removing therefrom (1) a flattening removal quantity of material based on height data of a flatness and a parallelism of the front and back surfaces of the large-sized glass substrate stock in a vertical attitude, plus a deformation-corrective removal quantity of material, through the sand blasting, the deformation-corrective removal quantity is calculated from (2) a deflection of the glass substrate stock by its own weight in a horizontal attitude, calculated from the thickness and size of the large-sized glass substrate stock, and a support position when the regenerated photomask substrate is horizontally supported, (3) a deformation of the regenerated photomask substrate caused by a photomask substrate support when the regenerated photomask substrate is attached to the exposure apparatus, and (4) an accuracy distortion of a platen for supporting the mother glass to be exposed, and the regenerated photomask substrate resulting from the large-sized glass substrate stock has such an arcuate shape in cross section that a surface to be opposed to the mother glass is concave when held vertically, and reduces a proximity gap variation between the mother glass and the regenerated photomask substrate which is held horizontally when the opposed side edges of the regenerated photomask substrate are supported in a exposure apparatus.

2. The method of claim 1, wherein a quantity of material removed in steps (ii) and (iii) is at least 20 μm each from the front and back surfaces of the large-sized photomask-forming glass substrate stock to be regenerated.

3. The method of claim 1, wherein the repolishing step (iii) includes primary polishing and secondary polishing.

4. The method of claim 3, wherein the primary polishing uses a polishing slurry containing cerium oxide.

5. The method of claim 3, wherein the secondary polishing uses a polishing slurry containing cerium oxide or a slurry containing colloidal silica.

6. The method of claim 1, wherein the regenerated photomask substrate has a surface flatness corresponding to a surface flatness/diagonal length of up to $4.8 \times 10^{-5}$ in a horizontal attitude.

7. The method of claim 1, wherein the regenerated photomask substrate has a surface flatness corresponding to a surface flatness/diagonal length of up to $4.8 \times 10^{-5}$ in a horizontal attitude.

* * * * *